United States Patent [19]
Oh et al.

[11] Patent Number: 5,669,513
[45] Date of Patent: Sep. 23, 1997

[54] WAFER CARRIAGE

[75] Inventors: Jae-young Oh; Suk-yong Jeong; Han-sung Kim; Jin-ho Park, all of Kyungki-do, Rep. of Korea

[73] Assignee: Samsung Electronics Co., Ltd., Suwon, Rep. of Korea

[21] Appl. No.: 604,782

[22] Filed: Feb. 23, 1996

[30] Foreign Application Priority Data

Sep. 25, 1995 [KR] Rep. of Korea .............. 95-31664

[51] Int. Cl.$^6$ .............................................. A47F 7/00
[52] U.S. Cl. ......................... 211/41; 206/454; 118/500
[58] Field of Search ..................... 211/40, 41; 206/454; 118/500, 728

[56] References Cited

U.S. PATENT DOCUMENTS

| | | | |
|---|---|---|---|
| 4,727,993 | 3/1988 | Mirkovich et al. | 211/41 |
| 5,217,341 | 6/1993 | Webber et al. | 211/41 X |
| 5,219,079 | 6/1993 | Nakamura | 211/41 |
| 5,255,797 | 10/1993 | Kos | 211/41 |
| 5,351,836 | 10/1994 | Mori et al. | 211/41 |
| 5,492,229 | 2/1996 | Tanaka et al. | 206/454 X |
| 5,534,074 | 7/1996 | Koons | 206/454 X |

*Primary Examiner*—Robert W. Gibson, Jr.
*Attorney, Agent, or Firm*—Cushman Darby & Cushman, IP Group of Pillsbury Madison & Sutro LLP

[57] ABSTRACT

A wafer carriage is disclosed. An edge of the wafer carriage is roundly formed so that an edge of the wafer when colliding against the wafer can be prevented from chipping, pads are provided to a guide on the upper side of the wafer carriage so that the wafer when moving can be prevented from sliding, and thus, the wafer chipping occurred in a successive process can be prevented.

10 Claims, 3 Drawing Sheets

FIG. 4 (PRIOR ART)
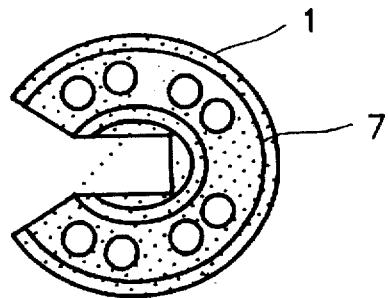
FIG. 5 (PRIOR ART)
FIG. 6 (PRIOR ART)
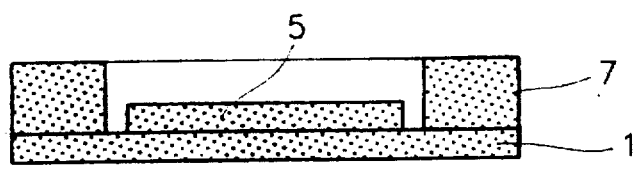
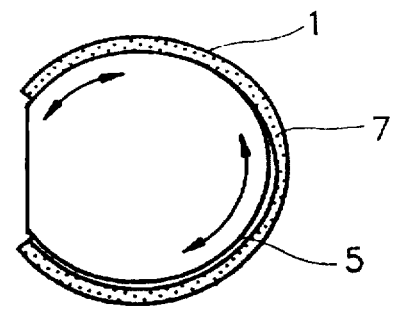
FIG. 7
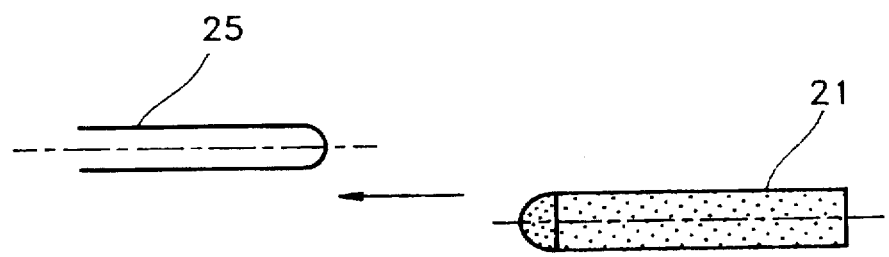
FIG. 8
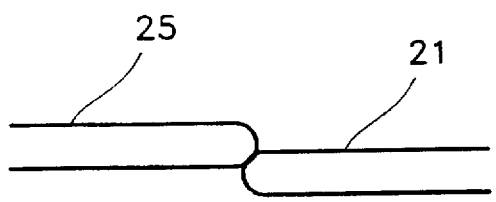

WAFER CARRIAGE

BACKGROUND OF THE INVENTION

The present invention relates to a wafer carriage, and more particularly, to a wafer carriage wherein edge chipping of a wafer can be prevented from occurring during the process of manufacturing a semiconductor.

Various types of failures occur during the process of manufacturing a semiconductor. In particular, the edge chipping of a wafer causes additional wafer chipping in successive processes and the chipped particles of the wafer contaminate the wafer so that the reliability of the semiconductor device is deteriorated. In general, it is known that wafer edge chipping more frequently occurs in wafers having larger diameters, for example, 8" wafers have more possibility of edge chipping than 6" wafers.

Such edge chipping occurs by mechanical impact, i.e., by the collision between the wafer carriage and the wafer, or occurs when clamping a wafer misaligned due to the wafer's sliding movement into a process chamber during loading of the wafer into the wafer carriage The conventional wafer carriage will now be described in detail as follows.

FIG. 1 schematically shows carrier 3, wafer 5 and wafer carriage 1 for illustrating failures which occur when a wafer is being loaded. It shows the state where wafer carriage 1, aligned by a wafer carrying apparatus, loads wafer 5 in carrier 3. Here, an increase in thickness of a wafer accompanying enlargement of the wafer diameter leads to narrowing intervals between wafers, and increasing chance of collision between the edge of the wafer and the edge of the wafer carriage due to misoperation and mis-alignment of the wafer carrying apparatus.

FIGS. 2 and 3 are side views for illustrating the failure mechanism occurring in the side structure of a conventional wafer carriage 1. The edge of the conventional wafer carriage 1 is in rectangular or quasi-rectangular shape. When wafer 5 is loaded on such wafer carriage 1, if the edge of wafer carriage 1 collides against wafer 5, approaching to it, so that the edge of wafer 5 chips (see FIG. 3), the equipment for controlling wafer carriage 1 misoperates or misalignes the wafer carriage's accesses to wafer 5 (see FIG. 2).

FIG. 4 shows a plan view of conventional wafer carriage 1. Wafer carriage 1 is in a round disc form with an open entrance and a plurality of holes on the disc. A guide 7 is formed along the border thereof for preventing wafer 5 from deviating when wafer 5 is loaded.

FIG. 5 shows the state where a wafer is loaded on conventional wafer carriage 1 shown from the entrance of wafer carriage 1. Guide 7 is protruded at the border of wafer carriage 1, to thereby prevent wafer 5 from deviating from wafer carriage 1.

FIG. 6 is a plan view showing the state where wafer 5 is loaded on conventional wafer carriage 1. Wafer 5 loaded on wafer carriage 1 is likely to slide and tilt to one side when wafer carriage 1 moves since the upper part of wafer carriage 1 is slippery. Here, when wafer 5 is loaded as tilted in a process chamber, the wafer is apt to chip when clamped due to misalignment.

As described above, in the conventional wafer carriage, an edge of the wafer can be chipped due to its colliding against an edge of the wafer carriage, and can be chipped due to misalignment when the wafer is loaded on the wafer carriage. Even after being loaded, the wafer is likely to slide and tilt to one side on the wafer carriage during the wafer carriage's movement. Therefore, when the wafer is loaded in a process chamber, the wafer is misaligned, and thus is apt to chip when clamped. As a result, the wafer chip can cause damage to other parts of the wafer or photoresist ignition due to leakage of helium in successive process, so that reliability of the semiconductor device is seriously affected.

SUMMARY OF THE INVENTION

Accordingly, it is an object of the present invention to provide a wafer carriage for preventing an edge of a wafer from being chipped.

To accomplish the above object of the present invention, there is provided the wafer carriage in a form of a round disc with a guide along the border wherein the entrance is open, an edge of the entrance is round shaped, and pads are provided inside the guide on the upper side of the wafer carriage.

It is preferable that the pads are formed in the smaller circumference of a circle than that of the wafer and the height of the pad is lower than that of the guide. Preferably, three or more pads are formed.

It is also preferable that the round shaped edges of the wafer carriage entrance has curvature corresponding to a half circle of a radius T/2, where "T" denotes a thickness of the wafer carriage, or in a streamlined shape.

BRIEF DESCRIPTION OF THE DRAWINGS

The above objects and advantages of the present invention will become more apparent by describing in detail a preferred embodiment thereof with reference to the attached drawings in which:

FIG. 4 is a plan view of the conventional wafer carriage;

FIG. 5 is a side view showing the state where a wafer is loaded on the conventional wafer carriage, seen from an entrance of the wafer carriage;

FIG. 6 is a plan view showing the state where a wafer is loaded on the conventional wafer carriage;

FIGS. 7 and 8 are sectional views for illustrating a mechanism in which a wafer is loaded on a wafer carriage according to the present invention;

DETAILED DESCRIPTION OF THE INVENTION

Figure 1:
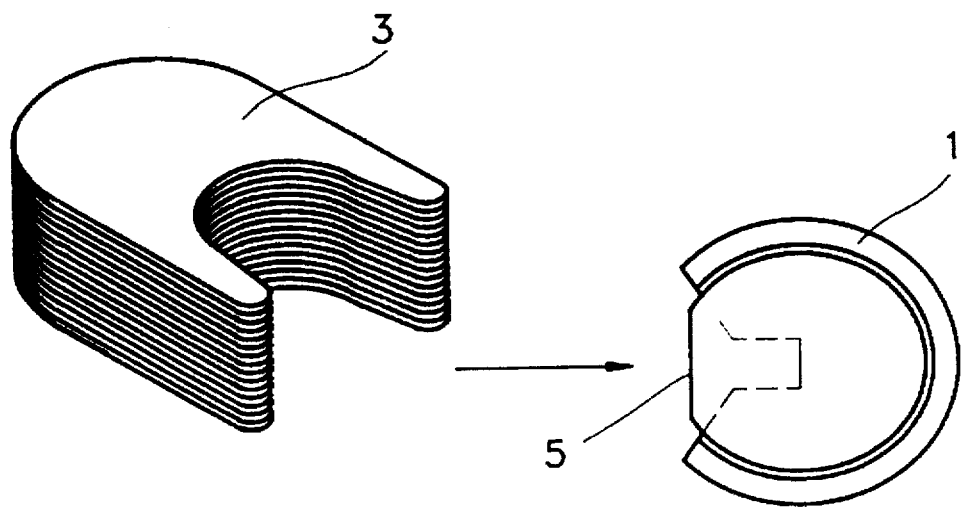
FIG. 1 is a view showing schematically a carrier, a wafer, and a wafer carriage for illustrating failures which can occur when a wafer is loaded.
Figure 2:
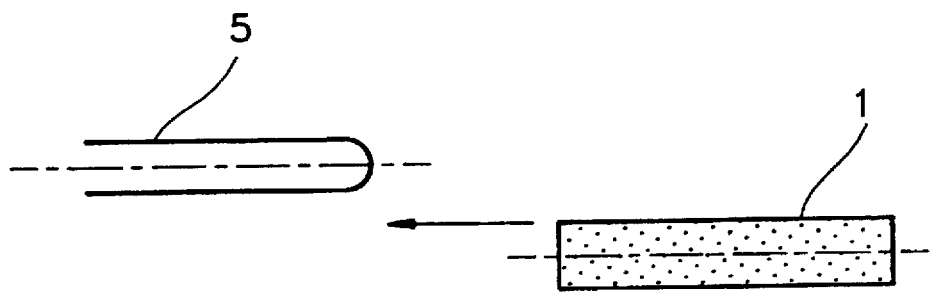
FIGS. 2 and 3 are side views for illustrating a conventional failure mechanism occurring at the side structure of a conventional wafer carriage.
Figure 3:
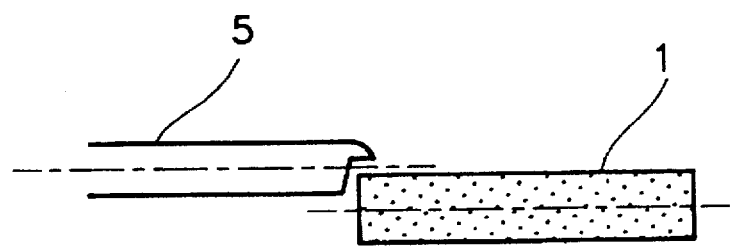

FIGS. 7 and 8 are sectional views for illustrating a mechanism in which wafer 25 is loaded on wafer carriage 21, according to the present invention. When wafer 25 and wafer carriage 21 collide against each other due to misalignment or misoperation of the equipment for controlling wafer carriage 21, or the wrong position of wafer 25 or change in the position of wafer carriage 21, the problem involving the conventional wafer carriage of having an angular side edge causing the wafer to chip when colliding (see FIG. 3) will not occur. In the present invention, wafer carriage 21 having a round edge disperses the force imposed to wafer 25 when colliding, and thus clippings at the edge of the wafer is avoided (see FIG. 8). In order to manufacture wafer carriage 21 according to the present invention, the edge of wafer carriage 21 is polished so that a smooth surface of an edge portion of wafer carriage 21 leads to reduce frictional force when colliding against wafer 25, thereby preventing edge chipping of wafer 25.

Figure 9:
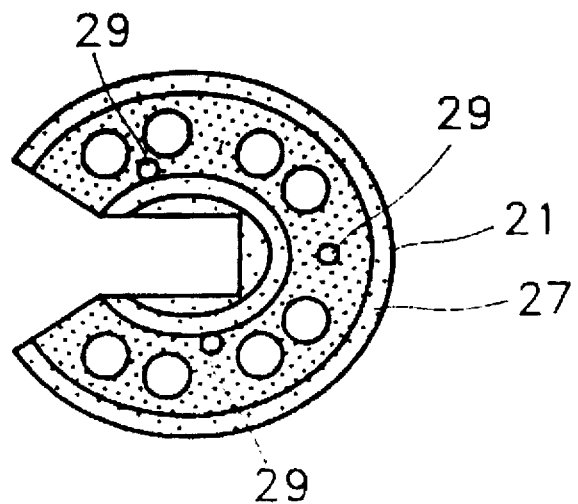
FIG. 9 is a plan view of a wafer carriage according to the present invention.

FIG. 9 shows a plan view of wafer carriage 21 according to the present invention. Wafer carriage 21 is in a round disc form, has an open entrance and a plurality of holes formed on the disc. A guide 27 is formed at the border of wafer carriage 21 for preventing wafer 25 from leaking out when wafer 25 is loaded. Three or more pads 29 are formed at the upper portion of the inner surface of wafer carriage 21.

Figure 10:
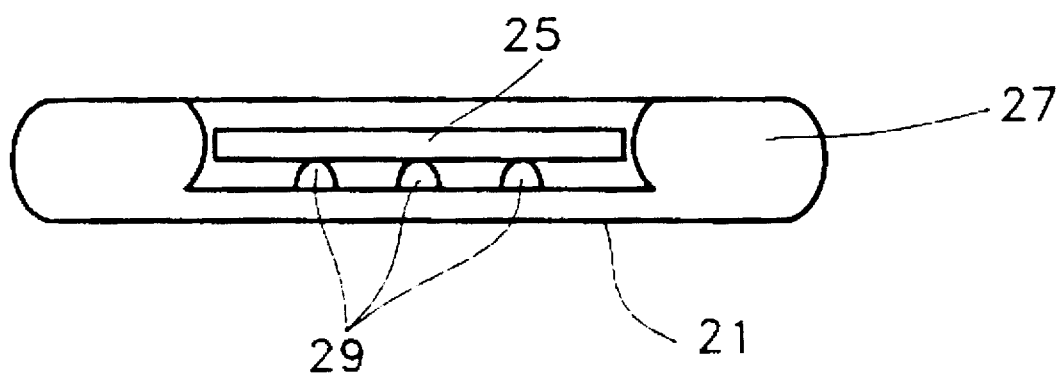
FIG. 10 is a side view showing the state where a wafer is loaded on a wafer carriage according to the present invention, seen from an entrance of the wafer carriage.

FIG. 10 shows the state where wafer 25 is loaded on wafer carriage 21 according to the present invention. Wafer carriage 21 has a guide 27 at its border. Pads 29 are formed inside wafer carriage 21 with wafer 25 lying on pads 29. Pads 29 should be formed along a circumference smaller in diameter than that of wafer 25 to lay wafer 25 thereon so that the wafer can be balanced. The height of pads 29 should be lower than that of guide 27 to prevent wafer 25 from falling outward when wafer 25 is being loaded.

Further, an edge of wafer carriage 21 is in a form of a half circle a radius "T/2" where "T" denotes a thickness of the wafer carriage, or in a streamline shape. Accordingly, edge chipping by colliding against the wafer is prevented when the wafer is being loaded on the wafer carriage.

As described above, according to the present invention, when the wafer is being loaded on the wafer carriage, even though edges of the wafer and of the wafer carriage's entrance are collided against each other, wafer chipping can be prevented since an edge of the wafer carriage is round. Besides, when the wafer carriage moves, the pads installed in the wafer carriage prevents the wafer, lying on the pads, from moving so that chipping in a successive process can be avoided.

What is claimed is:

1. A wafer carriage having:

a main surface, the outer dimensions of which define a border;

a guide that protrudes from said main surface along portions of said border; and an entrance provided along a remaining portion of said border through which a wafer is loaded on said wafer carriage, said main surface adjacent said entrance having edges against which said wafer collides when being loaded on said wafer carriage, said edges being rounded.

2. A wafer carriage according to claim 1, further comprising a plurality of pads arranged on an inner region of said main surface of said wafer carriage.

3. A wafer carriage according to claim 2, wherein the number of said plurality of pads is more than three.

4. A wafer carriage according to claim 2, wherein said pads are arranged on said upper side of said main surface in a circular pattern, said pattern having a smaller circumference than that of said wafer.

5. A wafer carriage according to claim 2, wherein a height of said pads is lower than said guide.

6. A wafer carriage according to claim 1, wherein said rounded edges have a streamline shape.

7. A wafer carriage according to claim 1, wherein said rounded edges have a curvature of a half circle of radius T/2, where "T" denotes a thickness of said main surface of said wafer carriage.

8. A wafer carriage having:

a main surface, the outer dimensions of which define a border;

a guide protruding from said main surface along portions of said border; and a plurality of pads arranged on an inner region of said main surface of said wafer carriage.

9. A wafer carriage according to claim 8, wherein a height of said pads is lower than said guide.

10. A wafer carriage according to claim 8, wherein said pads are arranged on an upper side of said main surface in a circular pattern, said pattern having a smaller circumference than that of a wafer.

* * * * *